United States Patent [19]
Clark et al.

[11] Patent Number: 6,026,588
[45] Date of Patent: Feb. 22, 2000

[54] SUPERHEATED VAPOR DRYER SYSTEM

[75] Inventors: Robert H. Clark, New Brighton; Anthony K. Green, Minneapolis; Steven E. Sykes, Eagan, all of Minn.

[73] Assignee: Forward Technology Industries, Inc., Minneapolis, Minn.

[21] Appl. No.: 08/911,493

[22] Filed: Aug. 14, 1997

[51] Int. Cl.[7] ................................................. F26B 21/06
[52] U.S. Cl. ..................................... 34/77; 34/78
[58] Field of Search ............................. 34/378, 379, 391, 34/413, 443, 467, 470, 471, 497, 548, 552, 568, 72, 73, 74, 75, 76, 77, 78, 79

[56] References Cited

U.S. PATENT DOCUMENTS

| | | |
|---|---|---|
| D. 332,340 | 1/1993 | Schumacher et al. . |
| D. 338,024 | 8/1993 | Schumacher et al. . |
| 1,119,011 | 1/1914 | Grosvenor . |
| 3,632,480 | 1/1972 | Surprenant et al. . |
| 3,654,705 | 4/1972 | Smith et al. ............................. 34/368 |
| 4,078,974 | 3/1978 | McCord . |
| 4,389,797 | 6/1983 | Spigarelli et al. . |
| 4,421,794 | 12/1983 | Kinsley, Jr. ............................. 34/76 X |
| 4,466,202 | 8/1984 | Merten ..................................... 34/77 X |
| 4,506,520 | 3/1985 | McCord .................................. 62/196.4 |
| 4,621,437 | 11/1986 | Grande et al. ......................... 34/77 X |
| 4,804,007 | 2/1989 | Bran . |
| 4,860,460 | 8/1989 | Gaudreau et al. . |
| 4,860,643 | 8/1989 | Spearow . |
| 4,998,549 | 3/1991 | Bran . |
| 5,037,481 | 8/1991 | Bran . |
| 5,038,808 | 8/1991 | Hammond et al. . |
| 5,054,210 | 10/1991 | Schumacher et al. . |
| 5,085,238 | 2/1992 | Baldwin . |
| 5,090,432 | 2/1992 | Bran . |
| 5,111,596 | 5/1992 | Laurenty .................................... 34/578 |
| 5,167,808 | 12/1992 | Carr et al. . |
| 5,226,242 | 7/1993 | Schwenkler . |
| 5,248,393 | 9/1993 | Schumacher et al. . |
| 5,286,657 | 2/1994 | Bran . |
| 5,365,960 | 11/1994 | Bran . |
| 5,371,950 | 12/1994 | Schumacher . |

*Primary Examiner*—Henry Bennett
*Assistant Examiner*—Steve Gravini
*Attorney, Agent, or Firm*—Patterson & Keough, P.A.

[57] ABSTRACT

In a vapor drying system, solvents such as isopropyl alcohol (IPA) are boiled and condensed to provide a means of removing water and other contamination from process parts loaded into the equipment. The parts enter the apparatus via an automated lift assembly. Upon entering the vapor zone, solvent condenses on the parts and fixtures due to a temperature differential, displacing the contaminants. This condensate/contaminant waste stream gravity drains to a buffer tank below via a sloped, temperature-controlled drip tray. After vapor condensation on the parts ceases, drying is accomplished using superheated vapors formed in a stabilized zone generated by one or more offset boil sumps and separate vapor heat exchangers. Any liquid solvent remaining on the parts is flash-dried in the vapor zone, so that parts emerge clean and dry. The invention incorporates a computer-implemented PLC to control process parameters, cover mechanism, transport mechanism, safety features during operating, idle and standby conditions.

8 Claims, 11 Drawing Sheets

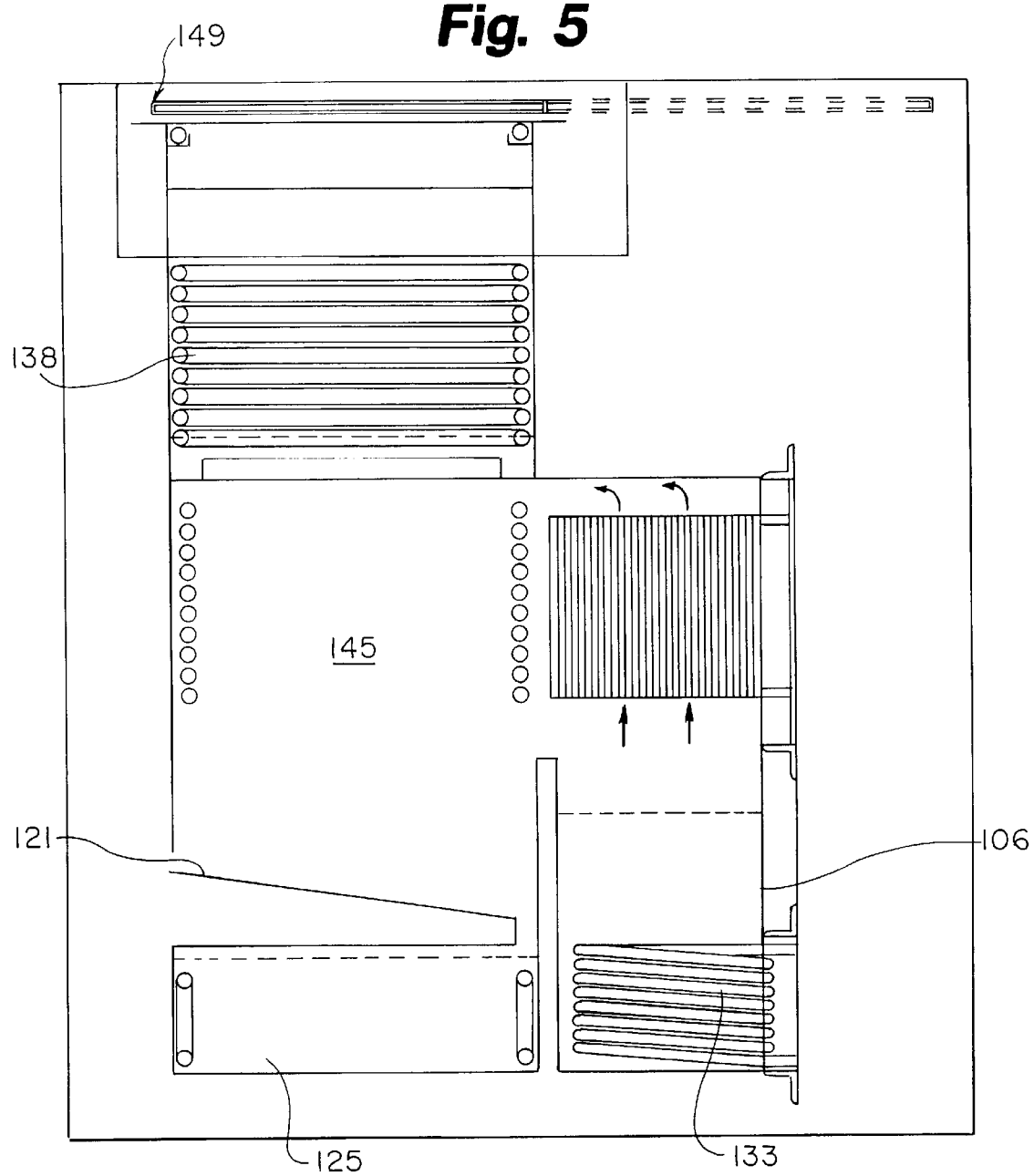

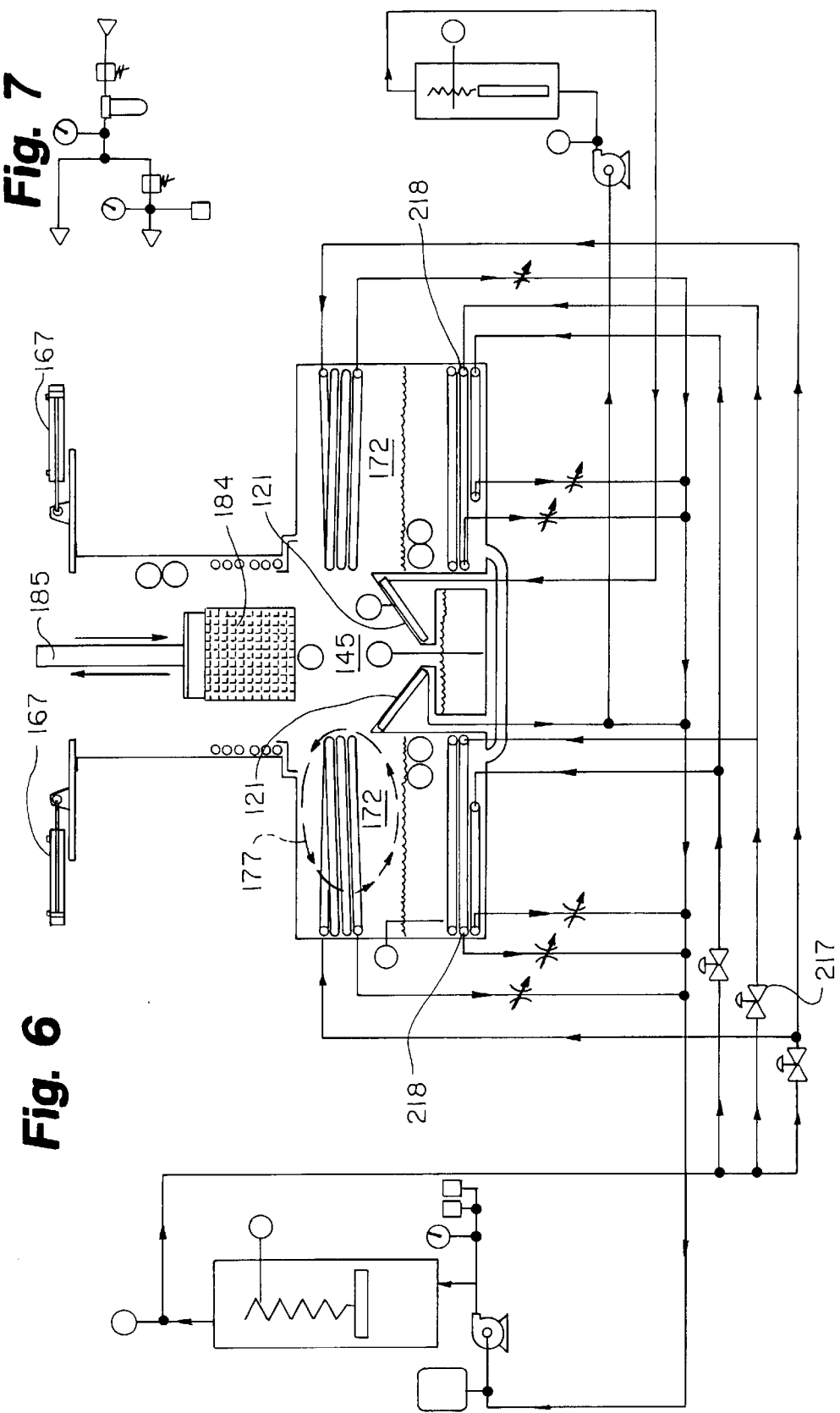

SUPERHEATED VAPOR DRYER SYSTEM

FIELD OF THE INVENTION

The invention relates to a superheated vapor dryer device and process in which a superheat is used to heat vapor above a saturation temperature to clean and dry parts. Particularly, the present invention relates to vapor dryers for use with flammable solvents such as isopropyl alcohol and equivalent low flash point solvents for precision removal of water and other contaminants from parts. The vapor dryer system is capable of precision regulation of temperature at high volume production of parts having varying numbers, geometry and surface areas.

BACKGROUND OF THE INVENTION

Various types of vapor degreasing and vapor drying devices and processes are known in the art for use in the removal of contaminants from process parts and components. Specifically, degreasers include machines designed to clean grease and foreign matter from mechanical parts and like items usually metallic by exposing them to vaporized or liquid solvent solutions confined in a tank or vessel. Generally, the solvents used in degreasers include polyhalogenated hydrocarbons that remove fat or oil from parts and related industrial processes. Unlike degreasers, however, the use of superheat to remove such contaminants requires a delicate balance of system components to establish and maintain a vapor zone within which much of the cleaning or drying is accomplished. Few, if any, systems exist which optimize heat balance, heat load, and throughput of components in the manner achieved by the present invention. However, of the systems which are at least known in principle, the following points are considered relevant.

Generally, vapor cleaners and dryers use various means for boiling a volume of solvent which results in heated vapors used to clean and/or dry the parts inserted into the vapor zone. Technical disclosures of such systems may specify use of quartz tanks, electric heaters, and other components so that boiling solvent is generated directly below a parts load. The parts may be separated from the boiling solvent (boil sump) by a drip tray. A common problem of these and similar systems relates to the re-flashing of water that has been removed from the parts as it gravitates toward the bottom of the system. This results in system inefficiencies and recontamination problems.

Known vapor dryers are also susceptible to vapor zone collapse under heavy parts loading. This "work shock" occurs when a large mass and/or surface area of process parts at a sub-cooled temperature rapidly condenses all available solvent vapor in the vapor zone, allowing surrounding air to rush into the dryer to fill the void. This condition is undesirable, as it allows for potential contamination of the parts, produces uneven heating and vapor rinsing as the vapor blanket is reestablished from the bottom up, and adds unnecessary delays to process cycle times while the vapor zone recovers.

Known vapor drying systems have also accomplished parts drying in an upper cooling zone above the air-vapor interface line in the condensing region. At the end of the rinsing cycle, process parts in these types of Systems have a thin film of liquid solvent, referred to as "dragout", remaining on them as they leave the vapor zone. In this upper cooling zone, the hot parts will immediately release this liquid to the relatively cooler air in the upper cooling zone via evaporation, allowing for the complete drying of parts before they are withdrawn from the system. This method is undesirable, however, as the solvent vapors are then scavenged by the system ventilation exhaust, or lost forever as fugitive vapor emissions out of the top of the equipment.

These and other problems are overcome by use of the superheated vapor drying techniques and system described below.

SUMMARY OF THE INVENTION

The invention comprises a superheated vapor drying device and process comprising a system in which flammable solvents such as isopropyl alcohol (IPA) and others with equivalent low flash points are boiled and condensed to provide a precise means of removing water and other contamination from process parts loaded into the device/apparatus. The parts preferably enter the apparatus, preferably in a batch, via an automated lift assembly. Upon entering the vapor zone, the solvent condenses on the parts and fixtures due to a temperature differential, thereby displacing the contaminants. This condensate/contaminant waste stream gravity drains to a buffer tank below via a sloped, temperature-controlled drip or collection tray. After vapor condensation on the parts ceases, drying is accomplished using superheated vapors generated by one or more offset boil sumps and separate vapor heat exchangers. Any liquid solvent remaining on the parts is flash-dried in the vapor zone, so that the parts emerge clean and dry.

Some of the unique features and advantages of the present invention include faster drying of parts and reduced solvent consumption. This is partly due to maintaining a stable vapor zone that does not collapse, thereby allowing shorter drying cycle times and greater throughput. Further, the temperature controlled collection tray is advantageously implemented to minimize reflashing of water/IPA back into vapor. Furthermore, dual sliding covers reduce vapor loss by minimizing disturbance of the air-vapor interface. The underside of the dual sliding covers is structured to collect and channel away fluids from incoming parts for collection and discharge before they contaminate the contents of the tank.

The invention is applicable, without limitations, in the precision removal of water from disk drive media, flat panel displays, semiconductor wafers, precision mechanical components, optical instruments, medical device's and components and similar manufactured parts.

BRIEF DESCRIPTION OF THE DRAWINGS

FIG. 5 is a schematic elevation view of a second embodiment of the superheated vapor drying system of the invention.

FIG. 6 is a schematic elevation view of a third embodiment of the superheated vapor drying system of the invention, including partial fluid flow path depictions.

FIG. 7 is a schematic of a control air system of the invention of FIG. 6.

DETAILED DESCRIPTION OF THE INVENTION

Figure 1:
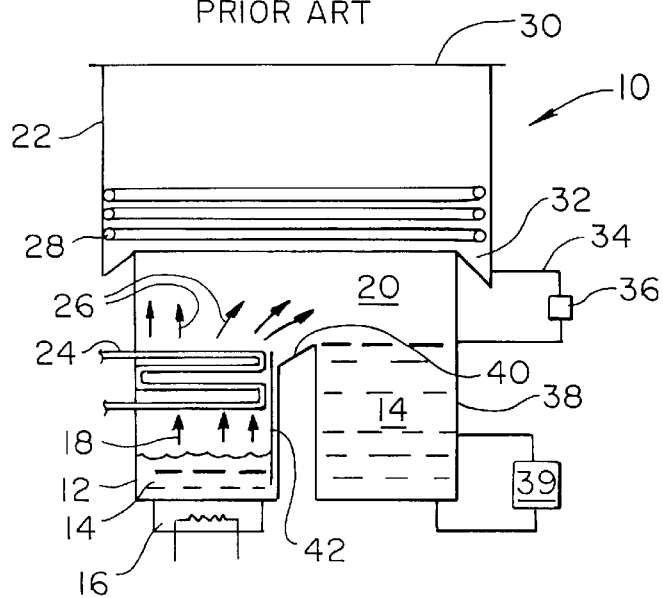
FIG. 1 is a schematic vertical view of a vapor degreasing apparatus.

A critical point in achieving superheat is not how much heat is added, but rather where it is placed. Once the system is saturated, temperature and pressure are no longer independent properties, and adding energy to the liquid will only increase the boil rate, not the vapor temperature. This is easily witnessed by turning up the stove heat on a pot of boiling water—it boils faster, but gets no hotter. However, if heat is added directly to the vapor phase at a constant pressure, the vapor temperature will increase into the superheated region.

When production parts are removed from the liquid, they are exposed to the superheated vapors. As heat is transferred into the parts, any liquid solvent remaining will be boiled off in the vapor zone, allowing clean dry parts to emerge from the system. Solvent vapors are contained by the primary condenser, well within the system freeboard. In a properly designed system, the cooling coils can easily remove the extra sensible heat from the vapor to contain the solvent.

Let us now consider a conventional vapor degreaser, vising a saturated vapor zone. Because the heat is added solely to the liquid phase, parts cannot be heated above the solvent boiling point, and the parts retain a thin film of liquid at the end of every vapor rinse cycle. This liquid cannot evaporate in a saturated vapor zone any better than sweat will dry from human skin in a steam bath. Thus, it is physically impossible to achieve complete drying in a saturated system.

Now, dry parts do emerge from vapor degreasers. As the parts exit the vapor zone, they enter the cooler air in the freeboard region. The higher temperature of the parts quickly drives off the liquid solvent into the atmosphere, and the parts emerge just as dry as if they were in a superheated system. However, one of the differences is that this method of flash drying results in fugitive solvent emissions from every single cycle, including fixtures and baskets.

Drying time in a superheated system can be several times faster than in a conventional degreaser, depending on part geometry. This is because the final temperature of the drying step is higher, and more energy is available to transfer into the solvent to vaporize it. Typical systems operate at a superheat of 20° F. to 40° F., but can run as high as 50° F. to 60° F. above the solvent's boiling point. This results in a drying time for an average 10-pound parts load of two to three minutes (confirmed with internal company testing).

Applications for superheated vapor drying are similar in some regards to standard vapor degreasers, including medical, electronic, aerospace, optical and precision mechanical components. The technology can be applied easily to both flammable and non-flammable solvents—if it can be boiled, it can be superheated. Representative solvents include isopropanol, cyclohexane, acetone, HCFCs, HFEs, methylene chloride, plus many others. For flammable solvents, even the elevated temperature of superheat is below the autoignition temperature for the solvent. For example, IPA boils at 181° F. Even a 50° superheat is well below the auto ignition temperature of 750° F.

As discussed, the generation of superheated vapors requires a secondary heat exchanger to add the necessary heat directly to the vapor phase. The problem with this is that the heat transfer coefficient (U-factor) for solvent vapors can be as little as 1/100th that of their corresponding liquids. Using the convective heat transfer equation:

Equation 1: $Q=UA(T_h-T_c)$

Where Q=heat transfer rate (Btu/hr)
U=overall heat transfer coefficient (Btu/hr/ft$^2$/20° F.)
A=heat transfer area (ft$^2$)
$T_h$=heat source temperature (20° F.)
$T_c$=heat sink temperature (20° F.)

We see that for the same heat transfer to occur with the same heat source and an equal degree of superheat, the surface area of the heat exchanger must increase by a factor of 100. Additionally, the driving force for solvent through the system is its boiling and condensing. Hence the rate of boiling controls the residence time of the vapors within the superheater. As the boil rate is increased, the vapor zone will eventually become completely saturated because the vapor passes by the superheater too quickly for heat to be adequately transferred. The need for a low boil rate to maintain superheat contradicts one of the key features of vapor degreasing—reflux. A high turnover rate of solvent is critical in maintaining a clean immersion bath by concentrating soluble contaminants in the boil sump, where parts never go. This phenomenon follows the exponential relationship Equation 2: $C_t=C_0 e^{(-Rt/V)}$ Where: $C_t$=concentration of contaminants at time t
$C_0$=initial concentration
R=removal (reflux) rate (gal/hr)
t=time (hr)
V=tank volume (gal)

For example, a 10 gallon immersion tank boiled and condensed at 10 gal/hr will be 63 percent clean after one hour, and 95 percent clean after three hours. Soluble contaminants are concentrated in the boil sump (see FIG. 2).

An additional concern regarding the reflux rate is that enough heat exists to maintain the vapor blanket when cold parts are inserted into the vapor zone. This is known as "work shock" and inserts yet another variable into the heat transfer balance. If the heating is inadequate, the vapor blanket will collapse, air will be entrained, and the air-laden solvent vapor will be displaced out of the system when the vapor blanket is restored. Also, as the boil sump is filled with soluble contaminants, the boiling point of the solvent will elevate, requiring additional heat to boil the solvent. The controls on a superheated system can get rather complex, as the delicate balance between reflux and superheat is managed in a production environment.

The requirements for tighter and tighter solvent systems now exist. These have been driven by environmental, health, safety and solvent consumption concerns. Because of the increased containment that it offers, superheated drying is an excellent choice to deal with any or all of these issues. For example, superheated vapor drying is one of the control technologies included in The National Emissions Standards for Hazardous Air Pollutants (NESHAP): Halogenated Solvent Cleaning. For example, for a batch vapor system (solvent/air interface <13 ft$^2$), four out of the ten allowable control combinations include the use of superheat. Operating losses from a superheated system can be as much as one-third those of a saturated degreaser, primarily due to lower dragout.

Superheat is not the only method of parts drying, but For solvent systems, it is one option. Because the parts are heated above the solvent's boiling point, liquid is flashed off almost any part geometry. In a traditional vapor degreaser (saturated system), drying is physically impossible inside the vapor zone, and thus occurs solely on dragout into the freeboard. It is certainly feasible to trap these vapors and reclaim them; however, additional containment measures must be taken. Superheated vapor drying provides a simple and cost-effective method of drying parts in solvent systems, while keeping the solvent inside the cleaning system, where it belongs.

Numerous problems exist in the field of vapor drying systems. Some of these problems are noted above. Others relate to fundamental inabilities of certain designs to achieve the desired performance for mechanical or thermodynamic reasons. Accordingly, the superheated vapor dryer system and apparatus of this invention is designed to overcome these many technical challenges by use of more capable and responsive heating and control systems. These systems allow rapid response to various heat loads and have various means for maintaining a stable and efficient superheated vapor zone.

Figure 2:
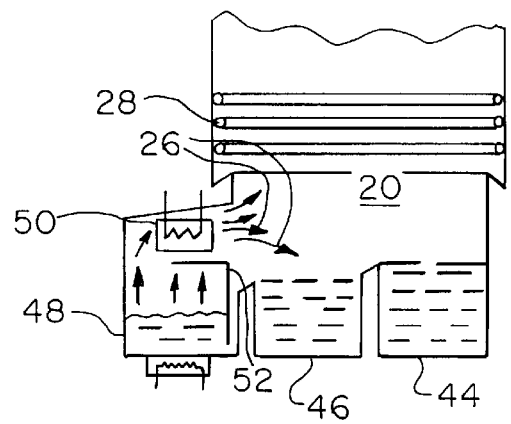
FIG. 2 is a schematic vertical view of another vapor degreasing apparatus.
Figure 3:
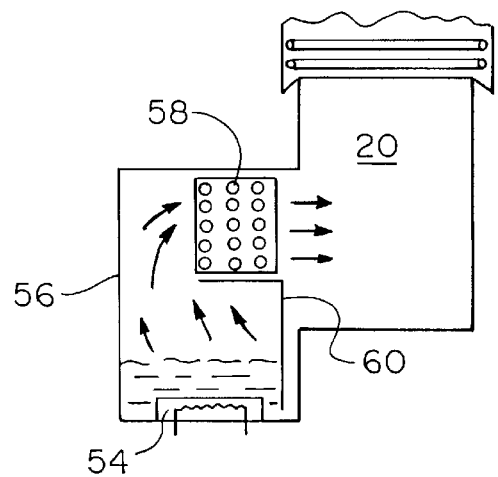
FIG. 3 is a schematic vertical view of another vapor degreasing apparatus.

Known publications disclose superheated vapor drying, but practical drawbacks clearly exist. For example, one system design utilizes heating the upper tank walls to raise the solvent vapors above the solvent boiling point. This method is likely feasible, but relatively ineffective in generating the level of superheat required for adequate parts drying. FIGS. 1–3 show other known superheat degreasing system designs, each having various inherent problems. In FIGS. 1 and 2, the systems are designed as immersion cleaning apparatus which first immerse the parts in the immersion sumps 38, 44, 46 and then dry the parts in the superheated vapors 18, 26. The system shown in FIG. 3 does not disclose preimmersion, but rather relies on merely the superheated vapors to clean the parts placed in the vapor zone. In each instance the figures disclose a configuration in which the sump 12, 48, 56 of boiling solvent which is generating the cleansing vapors is offset from the vertical location where parts are inserted in the device. Also, each figure discloses a baffle arrangement 42, 52, 60 designed to maintain the vapors emitting from the boil sump in a certain path that is routed through the superheating coils or heat generating sources 24, 50, 58.

Figure 4:
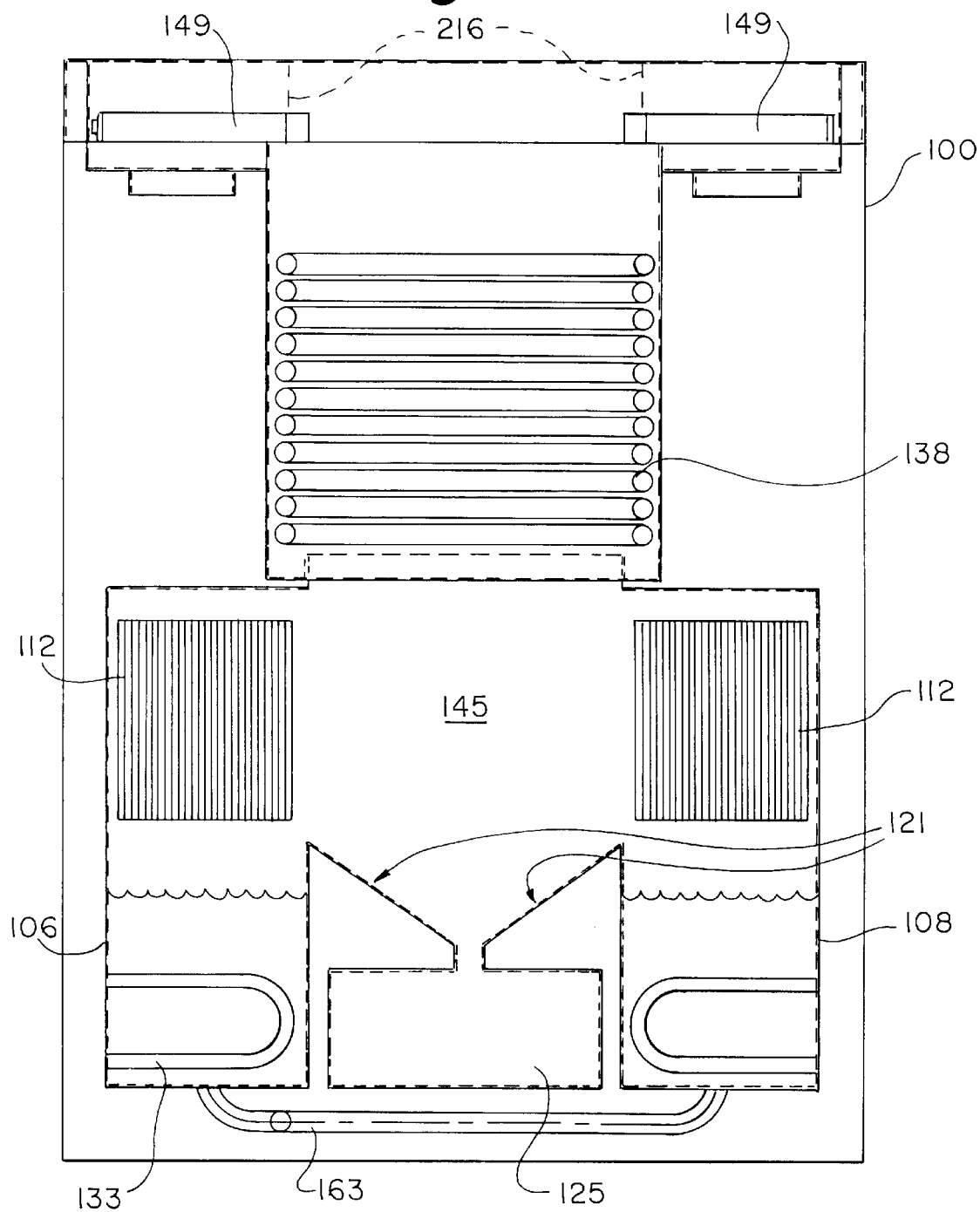
FIG. 4 is a schematic elevation view of a first embodiment of the superheated vapor drying system of the invention.

In sharp contrast, the superheating vapor dryer 100, shown schematically in FIG. 4, is a much advanced system of heating, cleaning, and drying, as well as a process of controlling overall batch precision cleaning operation. Vapor dryer system 100 is designed to remove water and other contamination from process parts by means of vapor condensation of solvent when the parts are placed in the machine. Drying is then accomplished through the use of superheated vapor drying. Due to the large difference in the overall heat transfer coefficient ("U-factor") between any liquid solvent and its vapor, a secondary heat exchanger of significantly greater surface area than in prior known systems is recommended for sufficient heat transfer directly into the vapor phase.

Figure 11:
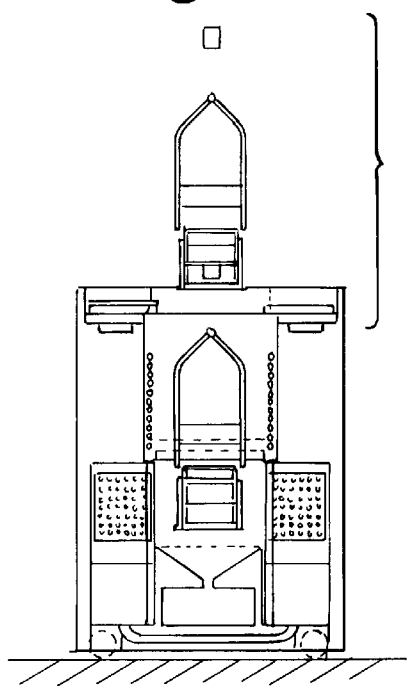
FIG. 11 is a schematic end elevation view of a third embodiment of the superheated vapor drying system of the invention.

The parts to be cleaned, and fixturing, are initially placed on either a set-down tray or suspended from hooks (as shown in FIGS. 6 and 11), and preferably enter the system by means of an automated lift arm at the start of the cycle. A continuous solvent vapor blanket is generated and maintained by means of a heat source in one or more offset boil sumps 106, 108. As the sub-cooled (below boiling) parts enter the vapor zone, vapor will immediately condense on them, providing a film of liquid which gravity drains to flush water and contaminants off of the parts. At the start of the cycle, additional energy is quickly supplied to the boil sump(s) to boost the vapor generation rate in order to overcome the initial rapid condensation until the parts warm up sufficiently. As the parts remain in the vapor zone, the temperature will gradually approach saturation, and condensation will cease as the evaporation and condensation rates between the parts and the vapor zone reach equilibrium. A secondary heat exchanger(s) 112 above each boil sump, with a large surface area relative to the boil sump heat source, transfers additional energy directly into the vapor phase, raising its temperature above the boiling point (superheat).

A preferred ratio of superheater surface area to boil sump heat generator surface area is greater than 1:1, with a more preferred ratio being greater than 2:1, and with the upper range determined by the various system parameters and control software algorithms. Some of the considerations for determining the ratio are discussed above, as well as other less well understood phenomena. For example, the size of parts and their entry temperature are factors which determine success or failure of operation. Therefore, system 100 provides means for sub-cooling parts prior to insertion into the system. In one embodiment, the sub-cooling consists of immersion in a bath of deionized water at a temperature of about ambient.

Another concern is the problem of reflashing contaminated condensate. This is caused when the water/solvent mix that drains off the parts initially contacts a drip tray or similar collection mechanism which is being heated by the same vapor path as is used for cleaning the parts. In previously known systems, this tray had no temperature control, and remained at the solvent saturation (boiling) temperature due to its continuous contact with rising vapors from the boil sump at the boiling point (e.g. 180° F. for isopropyl alcohol (IPA)). As the solvent vapor condenses on the parts to rinse and remove water contamination, it can form an azeotrope (up to 12.6 weight % water in IPA), and lower the mixture's boiling point (e.g. to 176° F. for water/IPA blend). These azeotropic droplets gravity drain from the parts, and contact the 180° F. drip tray below. This design allows re-flashing of the water/IPA azeotrope into the vapor phase, which results in deposition of water back onto the process parts, thereby leading to possible defects on the final product.

This technical problem is overcome in this invention by use of temperature controlled collection surfaces 121 which are held at a temperature slightly below the boiling point of the water/solvent mixture to prevent re-flashing of the droplets into vapor. A desired difference is at least about 50°–10° Fahrenheit below the boiling temperature of the solvent being used. The fluid then gravity drains into a buffer tank 125 directly below, with the slope of the tray designed steeply enough to minimize the transfer time into this buffer tank, thereby further discouraging re-flashing. In one embodiment, a slope of about 10° was utilized successfully. However, although other slopes are possible in view of particular system design features. The slope is also advantageously graded to enhance gravitational settlement of contaminant-laden condensate. From buffer tank 125, the water-solvent mix is pumped to an external waste receptacle. Makeup solvent to the boil sump(s) is likewise pumped into the system from an external clean solvent reservoir.

In addition to the features described above, FIG. 1 also discloses heating coils 133 as one means of providing a heat source to the boil sumps, and condensing coils 138 configured above the region designed to establish the vapor zone 145. In one embodiment, sliding doors 149 are provided to further control heat exchange and solvent loss.

As noted above, vapor generation is provided by one or more offset boil sumps, with a secondary heat exchanger, referred to as a superheater, directly above the boiling liquid. A single boil sump superheating vapor dryer embodiment is shown in FIG. 5. A multiple boil sump embodiment is shown in FIGS. 4, 6, 8, 11, 12. In the case of dual offset boil sumps, an equalizing line 163 between the sumps eliminates any variance in pressures and liquid levels. Equalizing line 163 cooperates with other mechanism and structures of the present invention to maintain the integrity of the vapor blanket. This is one of the many critical elements of the present invention. Specifically, by maintaining a stable vapor blanket, parts are thoroughly cleaned and dried without residual contaminants. More specifically, the dual offset boil sumps provide a vapor blanket with the capacity to fully envelope the part load, thus completely covering the total surface area on all sides simultaneously. The high energy vapor blanket assures clean and dry parts by flushing all water off the parts with IPA vapor. In sharp contrast, current art uses heat to flash off water while leaving behind contamination. For example, a flash drying process is used in existing vapor dryers due to of vapor blanket collapse during part load insertion. Examples of heat for the boil sump(s) and superheater(s) can be electrical immersion and, indirect hot water, glycol, or steam. As noted above, the heat generating capability or surface area of the superheater(s) should well exceed that of the boil sump(s) in order to overcome the poor heat transfer characteristics of the vapor phase, and ensure adequate heat transfer.

In operation, the parts to be cleaned are loaded in a sub-cooled state into the zone which will be controlled as a superheated vapor zone. The vapor is emitted from the boil sump(s) and then flows by natural convection through the superheater(s), then into the superheated vapor zone. The parts have now experienced condensation removal of contaminants/water. Moreover, the superheated vapor then dries the parts. The parts are subsequently lifted through the condensing coils to complete the drying process prior to removal.

Vapor not condensing on the parts rises to the primary condensing region, where the sensible (superheat) and latent heat of vaporization is removed and where the solvent returns to the liquid phase. Since this vapor presumably had no contact with the contaminated process parts, this distillate is considered pristine, and is returned directly to the boil sump(s) via downcomer plumbing, where the boiling and condensing cycle begins anew. Fugitive solvent emissions are minimized through the use of a horizontal sliding cover 167 which is shut during the drying cycle (i.e. the working mode), and is only open during process part entry or removal. This cover can be either a one or two-piece design, but always moves in a horizontal plane to minimize disruption of the air-vapor interface and to aid in the heat load maintenance process. This eliminates the undesired effect of vapor suction experienced during opening of conventional clamshell-type doors. In this embodiment, the bi-parting horizontal sliding cover system 167 moves in a single plane only, thus significantly reducing the draw of vapor out of the vapor dryer during parts positioning.

However, any vapor which rises beyond the primary condenser and the sliding cover is scavenged by a lip-vent exhaust manifold 216 as shown in FIG. 4, to minimize introduction of potentially flammable or toxic solvent vapors into the production environment. This lip-vent may be eliminated if benign solvents are used in the dryer. In one embodiment, this system comprises a flush mounted lip vent exhaust to facilitate robotic interaction with the vapor dryer for parts processing and in-line integration with related systems.

A gap 172 (FIG. 6) between the liquid level(s) in the boil sump(s) and the superheater(s) provides for multiple-pass heating of the solvent vapors, which rely greatly on convective fluid flow for heat transfer. Convective flow, shown in FIG. 6 by dashed lines 177, is aided by the cold draw effect of the sub-cooled parts 184 initially placed in the superheated vapor zone 145, as well as by the sub-cooled temperature controlled collection surface 121. Once again, this is another aspect of the advanced configuration and control mechanisms present in this invention which allow improved heat loading, reflux, vapor generation rates, and overall performance improvements. These and other features permit reliable system operation when drying even very large parts such as chip carrier trays or other components and equipment.

FIG. 6 further discloses lift system 185. In order to maintain the integrity of vapor zone 145 and minimize the reflex rate, (i.e., the rate at which the thermodynamic equilibrium recovers from the shock of the introduction of a cold object), lift system 185 is moved into and out of the tanks without vibration, oscillation or jerky movements. The movement profile of lift system 185 is controlled by a programmable logic controller. The insertion speed, the withdrawal speed and the linear motion within the tank is sensed to precisely locate the position of parts at any time in the tank. This unique feature of the present invention advantageously enables the integrity of vapor zone 145 to be maintained. This feature further enables a precise coordination between slide covers 167 and lift system 185.

FIG. 7 is a schematic view of a control air system for the embodiment of the invention shown in FIG. 6.

Figure 8:
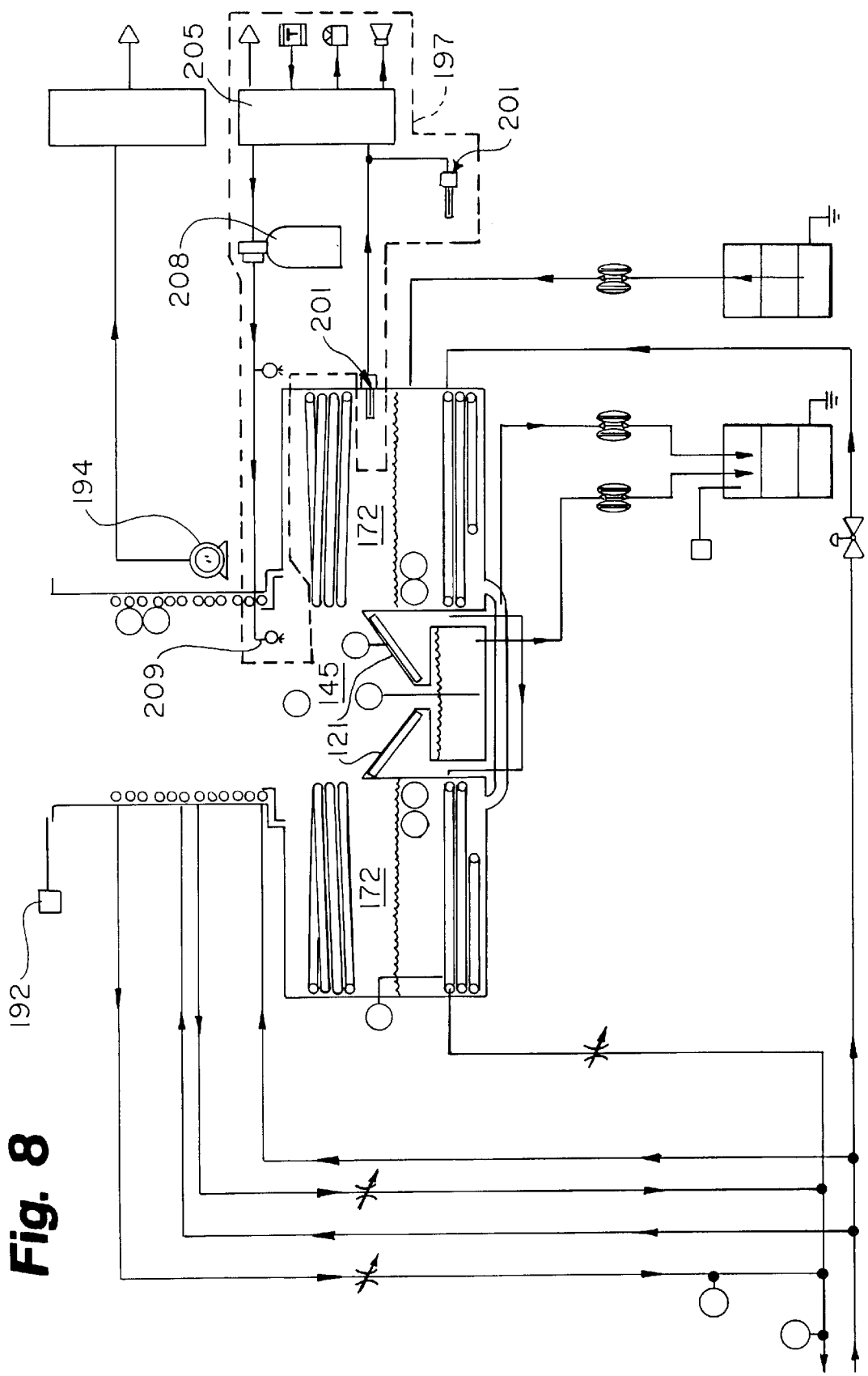
FIG. 8 is a schematic elevation view of a third embodiment of the superheated vapor drying system of the invention, including partial fluid flow path depictions.

FIG. 8 is a schematic elevated view of a third embodiment of the superheated vapor drying system of the present invention, including partial fluid flow paths, gas flow sensing sub-systems 192, 194, and a fire suppression sub-system 197. Gas flow sensing sub-system 192 provides sensing of lip vent gas flow as part of a lip vent exhaust system. Gas flow sensing sub-system 194 provides infrared gas detection between the tank and outer container. Fire suppression sub-system 197 includes sensing sites 201, activation, indication, and alarm panel 205, and $CO_2$ supply and discharge 208, 209.

Figure 9:
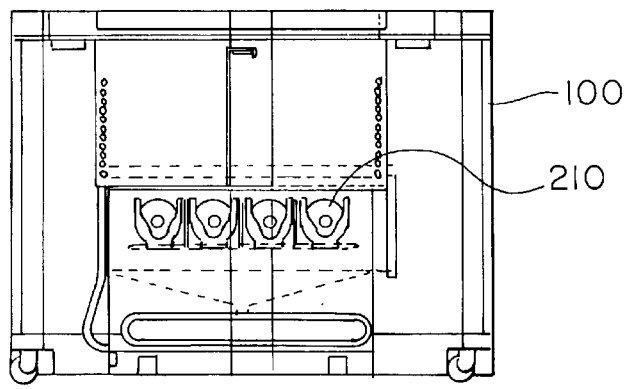
FIG. 9 is a schematic side elevation view of a third embodiment of the superheated vapor drying system of the invention.
Figure 10:
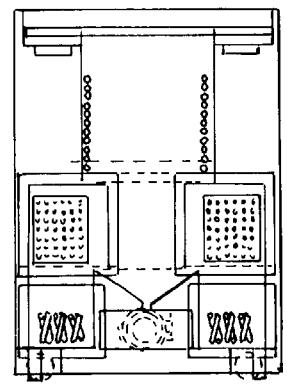
FIG. 10 is a schematic end elevation view of a third embodiment of the superheated vapor drying system of the invention.
Figure 12:
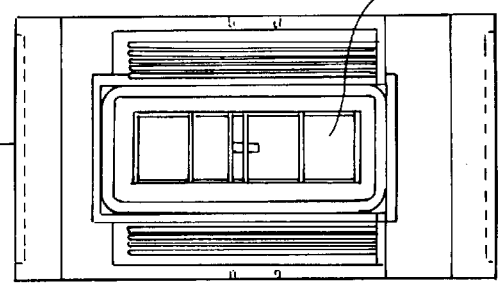
FIG. 12 is a schematic top elevation view of a third embodiment of the superheated vapor drying system of the invention.

FIGS. 9–11 show schematic elevated views of another embodiment of the superheated vapor drying system of the present invention. FIG. 12 shows a top view of that embodiment. These figures illustrate a plurality of wafer carriers 210 within vapor dryer 100.

Various modifications and features may be added to the vapor dryer embodiments disclosed above. One embodiment, known as the AD-Series, is manufactured by Forward Technology Industries, Inc., of Minneapolis, Minn., the assignee of record of the present invention. This system comprises means for maintaining a robust, stable vapor blanket which include use of the temperature controlled condensate collection tray, a vapor boost feature to reduce recovery time, and a working mode bi-parting horizontal sliding cover. In this embodiment, extra heat is added at the start of each process cycle to overcome the work shock of cold thermal mass entering the vapor zone. This vapor boost feature is achieved by providing means for opening a rapid response hot water isolation valve means for quickly multiplying the available heat exchange surface area. In this embodiment, a programmable time delay and boost duration feature provides automatic control for the supplemental heat exchange feature. This is a control feature not previously known in superheated vapor drying systems, in part because of the failure of manufacturers to appreciate the need for this feature in improving the control of the vapor blanked. This programmable time delay and boost duration is a controllable feature which is responsive to differing parts loads, but which, in combination with other novel features, creates a highly stable vapor drying system more suitable for higher throughput of parts than other systems. Referring to FIG. 6, coils 218 are controlled by PLC 230 and provide one means of achieving a vapor boost heating capacity.

Figure 13A:
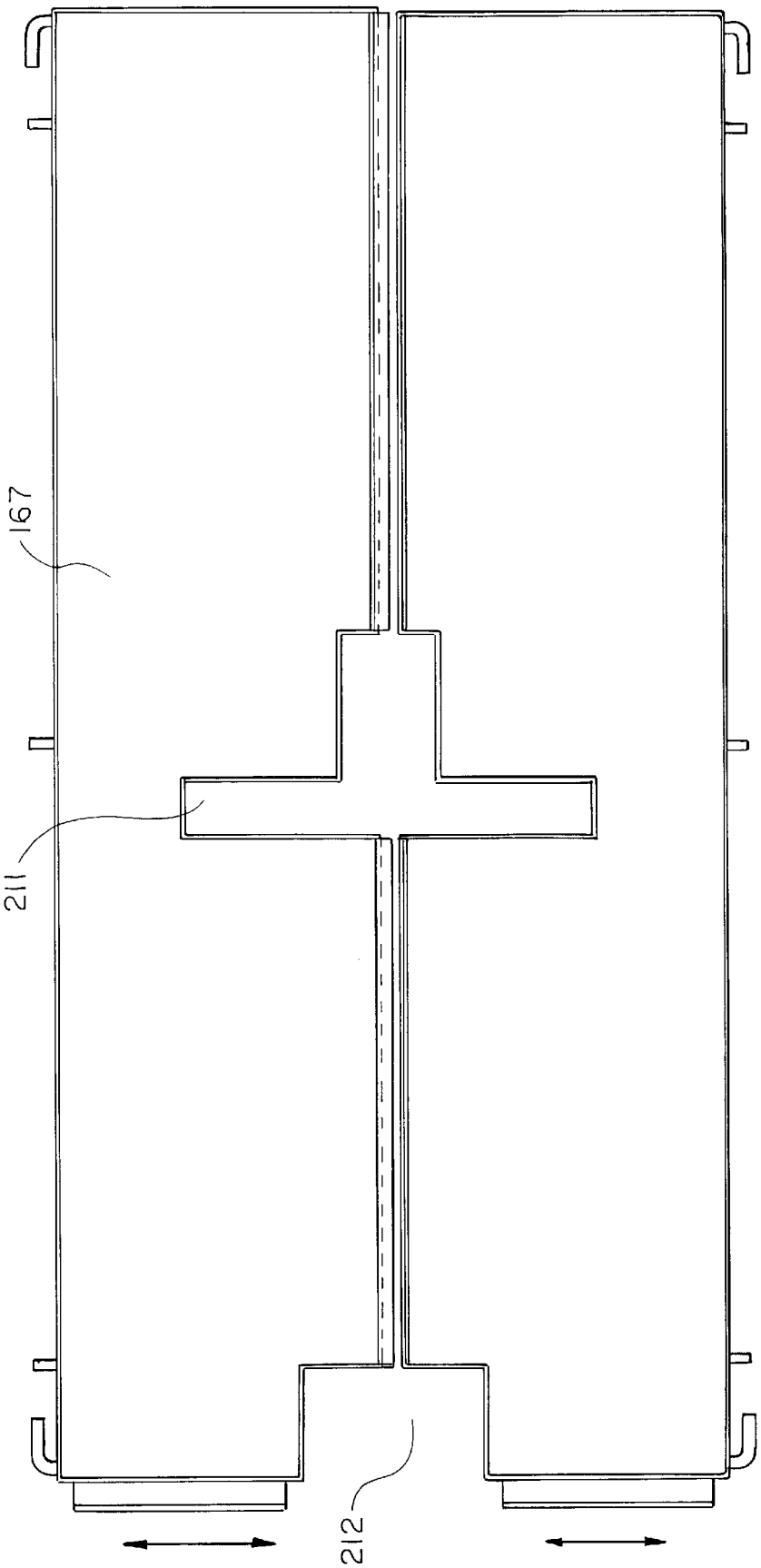
FIGS. 13A and 13B is a plan view and side view of the cover structure respectively.
Figure 13B:
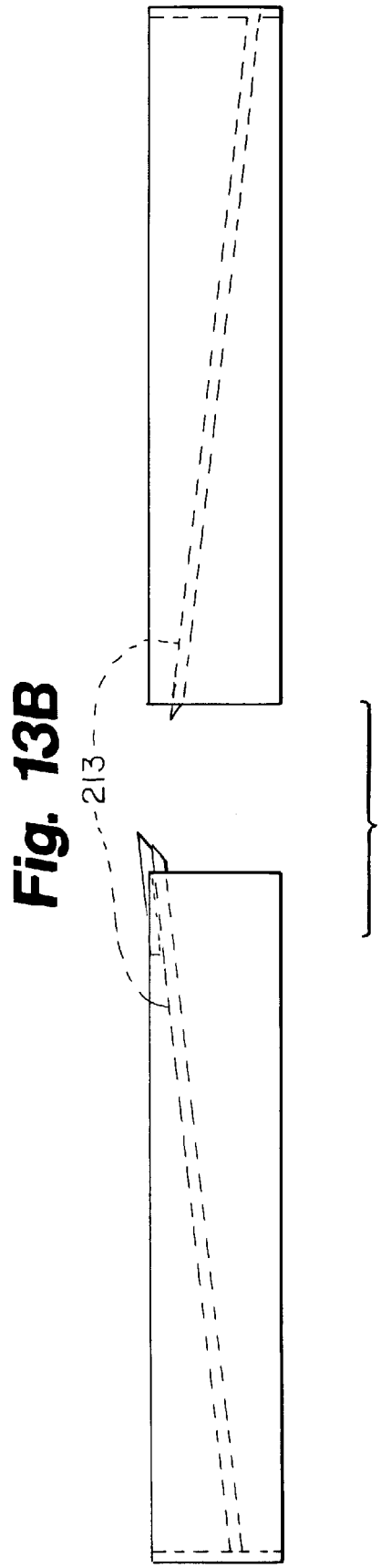

FIGS. 13A and 13B depict a top view and side view of slide cover 167, respectively. Bail opening 211 and transport opening 212 are shown as indicated. One of the unique features of slide (dual door) cover 167 is its horizontal movement, which avoids disturbance of vapor zone 145 and minimizes disturbance of vapor envelopes, thereby limiting vapor discharge into the surrounding environment. This is particularly important when dryer system 100 is installed in a clean room area. Another unique feature of slide cover 167 is drainage slope 213, a structure incorporated underneath slide cover 167. Drainage slope 213 traps water from incoming parts and channels it away to the side for discharge thereto. Drainage slope 213 is particularly noteworthy because it eliminates condensate drippage from the center section of dryer system 100, avoiding recontamination of dried parts. Moreover, drainage slope 213 reduces undesirable vapor discharge into the surrounding area.

Figure 14:
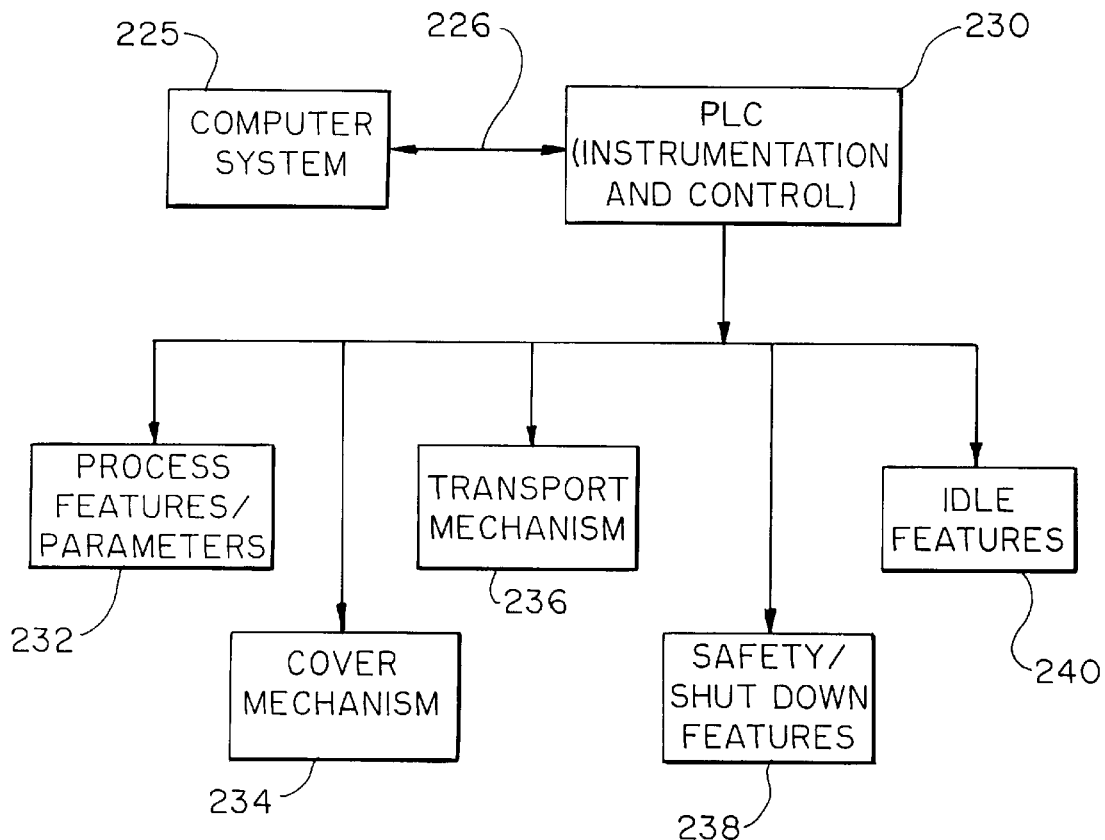
FIG. 14 is a high level block diagram of the programmable logic controller implemented in a computer system.

FIG. 14 is a high level block diagram of the software and associated significant subsystems. Specifically, computer system 225 provides a platform for implementing the software including Programmable Logic Controller (PLC) 230 via interface 226. PLC 230 controls process features and parameters 232, cover mechanism 234, transport mechanism 236, safety/shut down features 238 and idle mode features 240. In specific details, PLC 230 incorporates a panel-mounted operator interface module to control, change and monitor all system operating parameters and to display alarm status. Multiple recipes may be stored into PLC 230 via the operator module. PLC 230 may be password protected to control access to process features/parameters 232. Further, a modem may be provided to enable remote programming and monitoring of PLC 230.

As discussed hereinabove, vapor dryer system 100 of the present invention provides vapor chamber 145, with dual offset boil sumps 106 and 108 and super heaters 112 for vapor generation. Condensate from the parts is gravity drained via temperature controlled drip tray 121 to a buffer tank for external waste solvent recovery or disposal. For most part geometries, superheated vapor zone 145 will result in totally dry parts leaving vapor dryer system 100. A significant advantage of superheated drying is reduction of vapor losses and solvent usage due to dragout.

In addition to these major components, dryer system 100 includes sub-components and peripheral equipment and controls. The instrumentation and control of the major components, subcomponents and peripheral equipment includes process features/parameters 232, governed by PLC 230. Some of the elements of process features/parameters 230 include, inter alia, heating, cooling, exhaust control and vapor loss control. Tanks are heated by heat exchanger coils 133 immersed in the solvent. The fluid mixture in heat exchanger coils 133 is supplied by a pressurized, remote mounted electric heating system. The installed heating capacity on dryer system 100 is sufficient to heat dryer system 100 to operating temperatures from ambient temperatures in approximately 45 minutes; regulate the operational temperature in buffer tanks 125, vapor zone 145 and condensate drip tray 121 to a constant value; and maintain a high solvent distillation rate of at least 8 gallon/hour and a 20–50° superheat in vapor zone 145.

Both air and water cooling systems are advantageously implemented to provide system cooling. Typically, dryer system 100 requires approximately 10 gpm of cooling water at 40–45° F. Operations exceeding these parameters will not pose a significant problem, However, vapor emissions may rise to high levels. Dryer system 100 includes heating and cooling valves and fill and drain pumps, which are preferably pneumatically operated having a maximum 15 cfm of clean dry air at 60–90 psi. Similarly, exhaust control is an important feature of dryer system 100. Specifically, a blower capable of approximately 150 cfm of exhaust flow at 2 inch static pressure is required. The blower power source is independent of the main system so that the blower will remain in operation during idle or emergency shutdown conditions. Further vapor loss control features and parameters include a freeboard design to at least 100% freeboard ratio. Freeboard ratio is defined as the ratio of the distance from the top of the vapor zone to the top of the containment tank, divided by the minimum width of the opening at the air-vapor interface. This design minimizes vapor escape from the containment areas within dryer system 100. Other parameters which are advantageously implemented in the present invention include: heating the solvent vapor above the boiling point and allowing flash-drying to occur in super heated vapor zone 145. Further, extra heat is added at the start of each cycle to overcome "work shock" of cold thermal mass entering super heated vapor zone 145. This vapor boost heating in cooperation with heat from offset boil sumps 106, 108 enables virtually zero recovery time because the vapor zone is protected from collapse. Further, temperature controlled condensate collection tray 121 provides a sub-cooled surface to minimize re-flashing of liquid water into vapor, which would recontaminate cleaned parts The sloped structure further enhances water-rich condensate and condensate-entrapped contaminants to drip onto the sub-cooled surface of collection tray 121.

Cover mechanism 234 operates dual sliding covers 167. Sliding covers 167 open for loading and unloading of parts. Covers 167 move in only one plane, thus minimizing disturbance of vapor zone 145. PLC 230 operates the pneumatic controls for cover mechanism 234. The operation of cover mechanism 234 is coordinated and monitored to automatically shut after parts enter the process chamber and when the system is not in use. This feature drastically reduces solvent vapor losses during operating, idle and standby conditions.

PLC 230 further operates transport mechanism 236 Transport mechanism 236 controls lift system 185. Automated lift system 185 generally includes a cantilever-style vertical lift with a capacity of at least 50 lb. PLC 230 controls the rate of parts travel through vapor zone 145 to ensure adequate drying and minimize dragout of solvent. As discussed hereinabove, lift system 185 is interlocked to activate sliding covers 167 when parts are being loaded and unloaded into the system. Preferably, a variable-speed timing, belt-driven, DC electrical motor powers the lift arm of lift system 185. The lift position is preferably monitored and controlled via a string potentiometer (linear motion transducer) for precise position control.

Safety/shut down features 238 incorporate regulatory compliance, design safety, operational safety, design failure modes and design standards. The present invention includes features and standards such as, inter alia, National Fire Protection Association (NFPA) and related OSHA and local fire safety standards. Further, dryer system 100 incorporates all applicable NFPA standards and includes a system of redundant safety features which make it fully explosion-proof. The most important safety features include use of safe devices and components for use in high vapor concentration areas. Lip vent exhaust and sub-frame exhaust are incorporated for solvent vapor control and a comprehensive monitoring of exhaust flow. Further, solvent vapor is monitored to trigger a warning device at 15% of lower flammable limit (LFL) and additional warning triggered to affect automatic shutdown, electrical isolation, and accelerated cool-down of equipment at 25% LFL. Thermal sensors are preferably used to sense high temperatures or high rates of change in temperature. In case of fire, an integral $CO_2$ fire suppression system is incorporated. A gas warning system including an audible and visual warning device which activates at 15% LFL with an additional warning for automatic shutdown at 25% of LFL. Indirect tank heating is achieved by means of hot water heat exchangers 133 located in each heated tank. This design prevents solvent from reaching ignition temperatures even in the case of heater malfunction because the coil temperature cannot exceed boiling temperature of a water-glycol mixture at 50 psi. Further, as discussed hereinabove, freeboard design minimizes vapor escape from the containment tanks. Other safety features include a spill containment tray, a remote main electrical control cabinet, pneumatic controls and an emergency stop.

Operational safety considerations include maintaining connections to the main electrical supply as long as the system contains solvent. Further, parts are not introduced into dryer system 100 if the temperature at any point approaches the ignition temperature for the solvent being used. Under normal operation, the temperature of parts to be cleaned should be below the boiling point of the solvent.

Design failure modes are accompanied by system shut down at critical points to avoid fire, explosion and spillage. For example, if the exhaust blower fails, all power to the system is disabled by PLC 230 as part of a safety feature. Accordingly, the heating system stops delivering hot water to heating coils 133 and chilled water is allowed to flow through cooling or condensing coils 138. The system can be returned to operation only after the exhaust blower has been restarted and the system detects proper air flow.

Loss of electrical power from facility supply may result in shutting down the operation. Only the fire suppression panel has a back-up power supply to ensure continuous operation during a loss of facility electrical power. However, complete loss of power results in exhaust blower failure. Similarly, a loss of gas warning system will result in loss of electrical power except the exhaust blower will continue to operate.

PLC 230 monitors dryer system 100 during idle mode 240. Specifically, all safety features including gas sensors, liquid level controls, temperature monitors and alarms are active during the idle mode. Further, since the exhaust blower is the primary explosion prevention device, it is kept running even when the dryer system 100 is idle.

Figure 15:
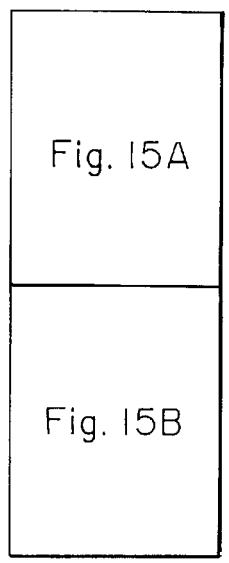
FIGS. 15A and 15B depict a high level program logic for the dryer system.
Figure 15A:
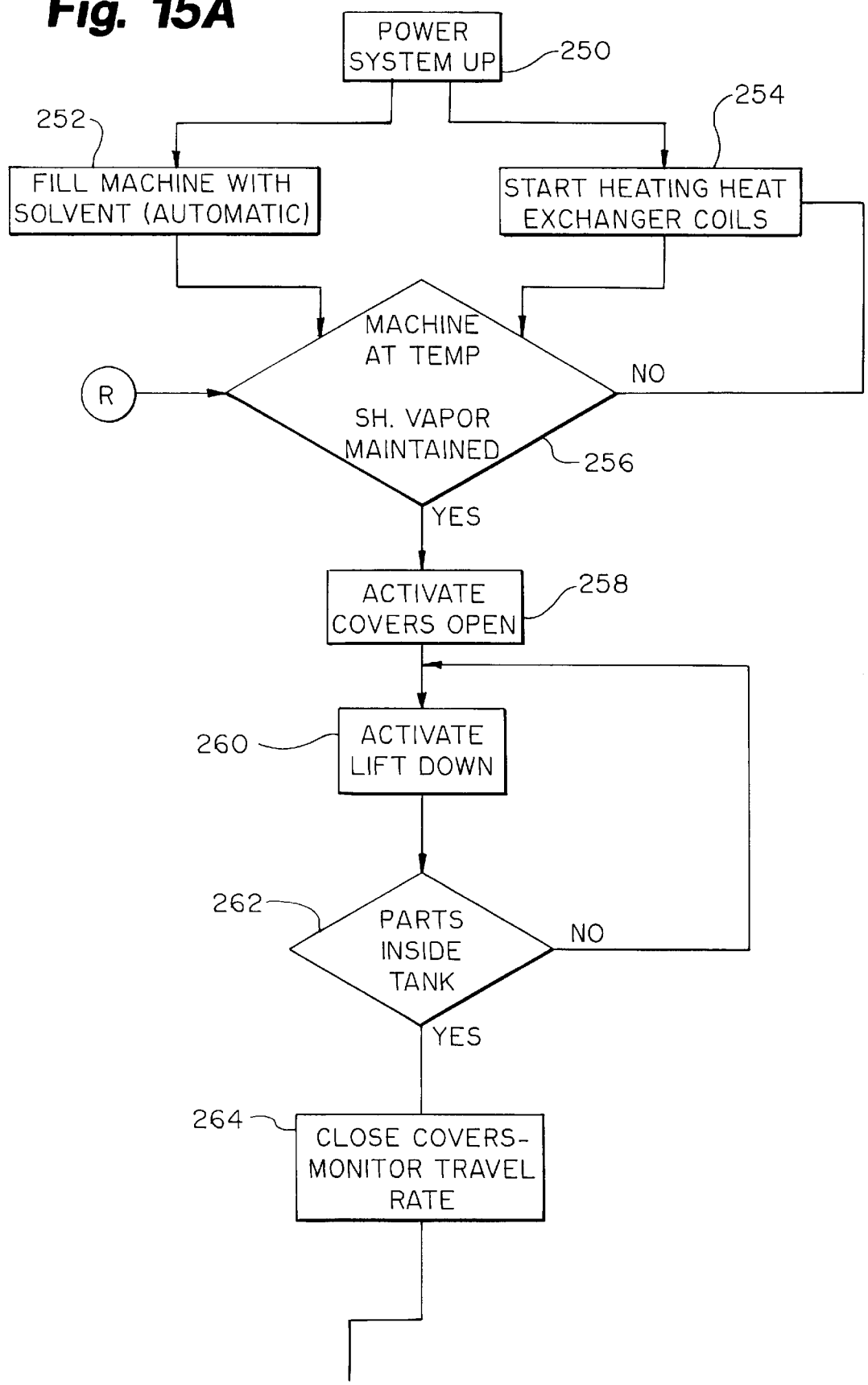
Figure 15B:
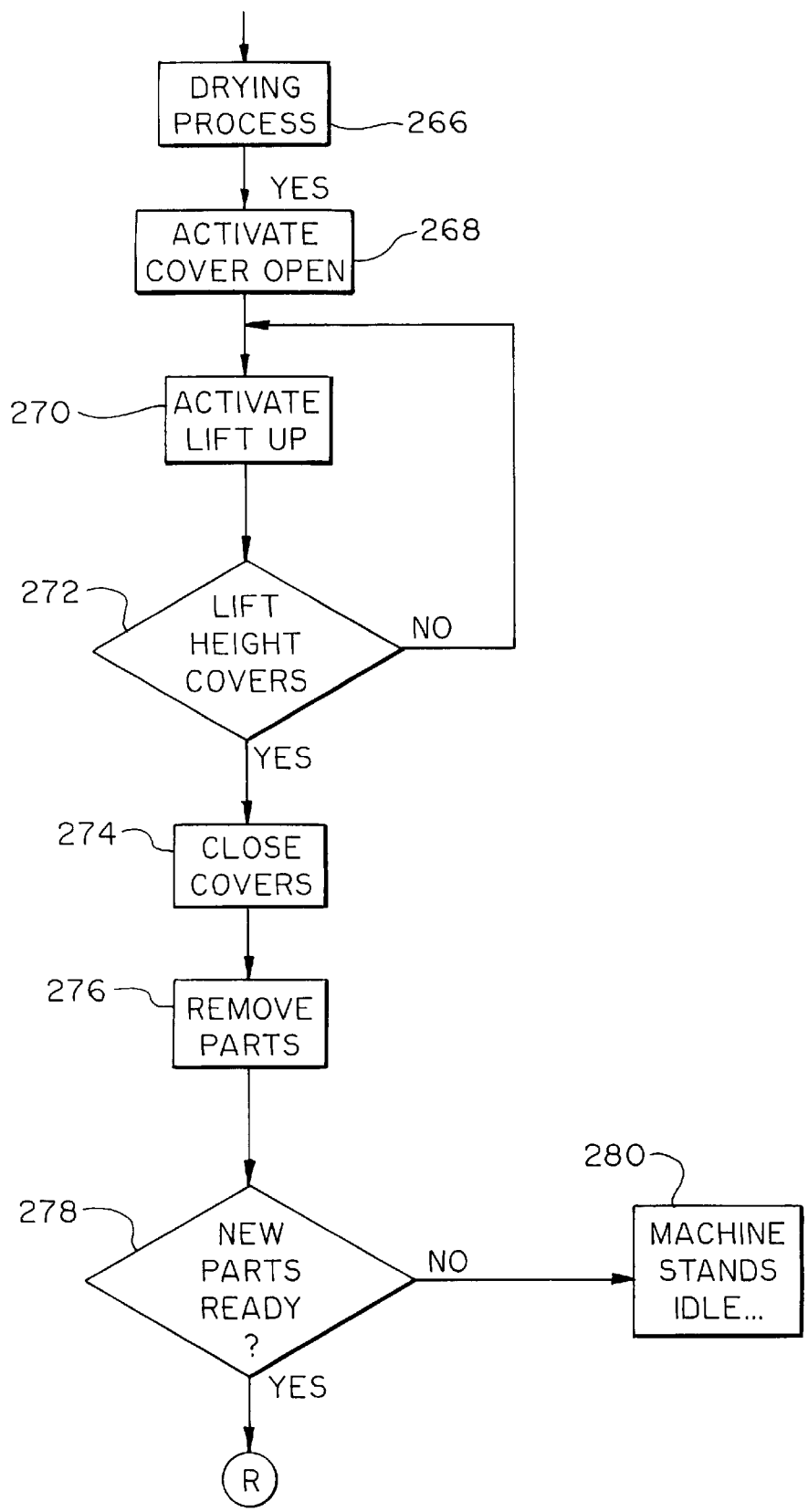

Referring now to FIGS. 15A–15B, the operation of dryer system 100 is initiated under logic step 250 by powering the system up. Fluid is supplied to heat exchanger coils 133 and condensing coils 138 and dryer system 100 is automatically filled with the necessary volume of solvent under logic step 252. Simultaneous with logic step 252, in logic step 254 heat exchangers 133 are heated and condensing coils 138 are cooled. This results in vaporization and condensation of the solvent and acts as a heat gradient or thermodynamic force. Additional heating of heat exchanger coils 133 under logic step 254 results in the creation of super heated vapor. PLC 230 checks to see if dryer system 100 is at the required temperature and if superheated vapor is maintained under decision block 256. If either dryer system 100 is not at the required temperature or if superheated vapor zone 145 is not established, the program logic reverts back to logic step 254 where heating of heat exchangers 133 is continued. When superheated vapor zone 145 is established and dryer system 100 is at the required temperature, the program logic proceeds to logic step 258 to activate and open covers 167. Subsequently, lift system 185 is activated downwards under logic step 260. The program logic proceeds to determine whether the parts are inside the tank under decision block 262. If the parts are not confirmed to be inside the tank, the logic reverts back to logic step 260 as indicated. When the parts are confirmed to be inside the tank, the program logic proceeds to close covers 167 and monitor the travel rate of lift mechanism 185 inside the tank under logic step 264. PLC 230 monitors the position and rate of travel of the parts after confirming that the parts are inside dryer system 100. Under logic step 266, the program logic dries the parts for a preset time interval. Thereafter, covers 167 are opened under logic step 268. Subsequently, lift mechanism 185 is activated under logic step 270. Thereafter, lift mechanism 185 is checked to see whether it has cleared covers 167 under decision block 272. If the covers have not been cleared, the program logic reverts back to logic step 270 to further activate lift mechanism 185 upwards. Once lift mechanism 185 is confirmed clear of covers 167, the program logic proceeds to close covers 167 under logic step 274. Thereafter, parts are removed under logic step 276. Dryer system 100 is then ready to accept new parts for cleaning under decision block 278. If there is a new batch of parts to be cleaned, the program logic reverts back to decision block 256 via subroutine R. In the alternate, if there are no new parts to be cleaned, the program logic proceeds to logic step 280 where dryer system 100 is maintained in idle mode.

Accordingly, the present invention provides an autonomous dryer system with advantageous design, safety, flexibility and maintainability features which are unique. Specifically, PLC 230 enables precision control and monitoring of vapor drying using cooperative devices and methods in a manner which is unknown hencebefore. More specifically, dryer system 100 of the present invention is adaptable to specific cleaning requirements and provides an automated programmable system, which reduces solvent usage, limits vapor emissions, and incorporates unique design features for safety and clean room compatibility. In summary, the design of the present invention is to effectively and efficiently dry parts with superheated vapors generated by an offset boil sump and heat exchanger while the parts remain in the vapor zone. As the parts are heated significantly (10–30° C.) above the solvent's boiling point, the remaining liquid film is flash-dried below the air vapor interface, with the resultant vapor being trapped by the primary condenser and contained within the system. The use of superheated vapor drying in the manner implemented by the present invention, reduces dragout losses, provides lower overall vapor emissions, enables greater environmental compliance, and lowers solvent consumption.

While the preferred embodiments of the invention have been shown and described, it will be obvious to those skilled in the art that changes and modifications may be made therein without departing from the invention in its broader aspects and, therefore, the aim in the appended claims is to cover such changes and modifications as fall within the spirit and scope of the invention.

What is claimed is:

1. A superheating vapor drying system having an outer container comprising:
    a. primary heat exchanger means for boiling a solvent in at least one boil sump;
    b. secondary heat exchanger means for heating solvent vapors to at least about 20° F. above the boiling temperature of the solvent and for creating a superheated vapor zone suitable for cleaning parts placed in the zone;
    c. primary condensing means for condensing any residue remaining on parts as the condensate is removed from the parts in the superheated vapor zone and enters a primary condensing region proximate the primary condensing means; and
    d. a fill and drain subsystem for providing fresh solvent to the system, removing contaminated solvent, and controlling temperature flow within the various heating means, the fill and drain subsystems comprising a temperature controlled drip tray for capturing, draining and collecting condensate removed from the parts while preventing re-flash of the condensate into vapor.

2. The system of claim 1, in which the outer container has top mounted, horizontally sliding, access doors, the access doors sized such that parts to be processed fit through the doors.

3. The system of claim 1, in which the secondary heat exchanger means comprises a supplemental heat each anger for providing additional heat transfer during a parts loading cycle.

4. A superheating vapor drying system including a programmable logic controller comprising:

primary heat exchanger means for heating a solvent;

secondary heat exchanger means for generating a super heated vapor of said solvent to create a superheated vapor zone stabilized to clean parts placed in the zone;

primary condensing means for condensing residue remaining on the parts as the condensate is removed from the parts in the superheated vapor zone and entering a primary condensing region proximate the primary condensing means;

a lift system operated by the programmable logic controller to place the parts with a known location in the superheated vapor zone and said primary condensing region;

a slide cover means operated by the programmable logic controller (PLC) to open and close a sliding cover mechanism in cooperation with a known location and direction of motion of said lift mechanism;

a condensate trap means including a temperature controlled collection tray; and a fill and drain subsystem for providing fresh solvent to the system, removing contaminated solvent, and controlling temperature flow within the primary and secondary heat exchanger means, the fill and drain subsystems including a drain trough attached to said slide cover means to drain away water from incoming parts, the PLC monitoring and coordinating the system function to enable precision vapor drying of the parts.

5. The system of claim 4, wherein said primary heat exchanger means includes dual tank systems defining a structure to provide containment for said solvent.

6. The dual tank system of claim 5, wherein said structure further provides a uniform vapor zone around the parts to promote high energy vapor cleaning and drying.

7. The system of claim 4, wherein said secondary heat exchanger means is structured to provide stabilization of the superheated vapor.

8. The system of claim 4, wherein said collection tray includes a tapered geometry to augment settlement of contaminates.

* * * * *